(12) United States Patent
Colgan et al.

(10) Patent No.: US 9,171,742 B2
(45) Date of Patent: Oct. 27, 2015

(54) ALIGNMENT OF INTEGRATED CIRCUIT CHIP STACK

(71) Applicant: International Business Machines Corporation, Armonk, NY (US)

(72) Inventors: Evan G. Colgan, Chestnut Ridge, NJ (US); Steven A. Cordes, Yorktown Heights, NY (US); Daniel C. Edelstein, White Plains, NY (US); Vijayeshwar D. Khanna, Millwood, NY (US); Kenneth Latzko, Carmel, NY (US); Qinghuang Lin, Yorktown Heights, NY (US); Peter J. Sorce, Poughkeepsie, NY (US); Sri M. Sri-Jayantha, Ossining, NY (US); Robert L. Wisnieff, Ridgefield, CT (US); Roy R. Yu, Poughkeepsie, NY (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 0 days.

(21) Appl. No.: 13/947,543

(22) Filed: Jul. 22, 2013

(65) Prior Publication Data

US 2015/0024549 A1  Jan. 22, 2015

(51) Int. Cl.
| | |
|---|---|
| H01L 21/00 | (2006.01) |
| H01L 21/50 | (2006.01) |
| H01L 25/00 | (2006.01) |
| H01L 25/065 | (2006.01) |
| H01L 29/06 | (2006.01) |
| H01L 23/02 | (2006.01) |
| H01L 23/48 | (2006.01) |
| H01L 23/52 | (2006.01) |
| H01L 29/40 | (2006.01) |

(52) U.S. Cl.
CPC ............ *H01L 21/50* (2013.01); *H01L 25/0657* (2013.01); *H01L 25/50* (2013.01); *H01L 29/0657* (2013.01); *H01L 2225/06513* (2013.01); *H01L 2225/06593* (2013.01); *H01L 2924/10156* (2013.01)

(58) Field of Classification Search
USPC ..................................... 438/106, 107; 385/52
See application file for complete search history.

(56) References Cited

U.S. PATENT DOCUMENTS

| | | | |
|---|---|---|---|
| 4,456,641 | A | 6/1984 | Ohtani |
| 4,853,271 | A | 8/1989 | Nakamura et al. |
| 5,247,423 | A | 9/1993 | Lin et al. |
| 5,429,859 | A | 7/1995 | Young |
| 6,085,007 | A | 7/2000 | Boudreau, Sr. |
| 6,383,837 | B1 | 5/2002 | Tsunashima |

(Continued)

FOREIGN PATENT DOCUMENTS

JP          8078772         3/1996

*Primary Examiner* — Mary Wilczewski
*Assistant Examiner* — Erik T Peterson (57) ABSTRACT

The present disclosure relates to methods and devices for manufacturing a three-dimensional chip package. A method includes forming a linear groove on an alignment rail, attaching an alignment rod to the linear groove, forming alignment channels on a plurality of integrated circuit chips, and aligning the plurality of integrated circuit chips by stacking the plurality of integrated circuit chips along the alignment rail. Another method includes forming an alignment ridge on an alignment rail, forming alignment channels on a plurality of integrated circuit chips, and aligning the plurality of integrated circuit chips by stacking the plurality of integrated circuit chips along the alignment rail.

20 Claims, 7 Drawing Sheets

(56) References Cited

U.S. PATENT DOCUMENTS

| | | |
|---|---|---|
| 6,554,560 B2 | 4/2003 | Sinha |
| 7,086,134 B2 | 8/2006 | Duatartas et al. |
| 7,290,321 B2 | 11/2007 | Duatartas et al. |
| 2002/0084565 A1* | 7/2002 | Dautartas et al. ......... 269/289 R |
| 2002/0196440 A1 | 12/2002 | Jeantilis et al. |
| 2006/0208350 A1* | 9/2006 | Poo et al. ...................... 257/692 |
| 2009/0087146 A1* | 4/2009 | Rolston et al. .................. 385/52 |
| 2011/0170266 A1 | 7/2011 | Haensch et al. |
| 2011/0188209 A1 | 8/2011 | Colgan et al. |
| 2012/0129276 A1 | 5/2012 | Haensch et al. |
| 2012/0307444 A1 | 12/2012 | Colgan et al. |
| 2012/0308241 A1 | 12/2012 | Colgan et al. |
| 2012/0314994 A1 | 12/2012 | Colgan et al. |

* cited by examiner (PRIOR ART)

ALIGNMENT OF INTEGRATED CIRCUIT CHIP STACK

FIELD OF THE DISCLOSURE

The present invention relates generally to three-dimensional stacking of microelectronics.

BACKGROUND OF THE DISCLOSURE

The implementation of three-dimensional (3D) stacking in microelectronics generally requires precise alignment of the plurality of devices being assembled. Various techniques have been demonstrated which vary based on the type of devices and how they are being assembled. In some cases, alignment is accomplished with standard alignment techniques because patterns on two parts are easily accessed and overlaid to each other. In other cases it is not possible to directly align the features, so other techniques must be used. Split optics is sometimes used to align two parts which do not have direct overlay capability. Split optics is a precision system using mirrors to project features from one part onto features from a second part. The technique requires a special tool which is maintained to be accurate. As this technique aligns only two parts at a time, it requires multiple alignments to align a plurality of parts, and therefore is slow for more than a small number, e.g. two to three parts.

To align large quantities of parts, e.g., more than three parts, edge banking is often used. In this technique edges of parts are banked against a common edge to provide a mechanical alignment. This technique allows many parts to be aligned quickly at one time. Unfortunately this technique is subject to alignment error and has issues with repeatability. The biggest challenge is that it requires that the banking edge be accurately aligned to the patterns. Generally the edge is defined by wafer dicing, which is known to have variable edge accuracy based on dicing blade width, stage precision, and edge chipping. This technique also requires some mechanism to maintain intimate contact with the common edge to ensure gaps do not form as additional parts are added or as the assembly goes through additional processes.

Another technique involves aligning each individual part to a secondary reference part. An optical alignment system is also required for this technique, for example a split optics system or other system which allows two separate images to be overlayed. This would be separate from the main assembly, but is referenced to the main assembly. This technique suffers from slow throughput and has issues with accuracy and calibration of the alignment system.

SUMMARY OF THE DISCLOSURE

In one embodiment, the present disclosure is a method for manufacturing a three-dimensional chip package. The method includes forming a linear groove on an alignment rail, attaching an alignment rod to the linear groove on the alignment rails, forming alignment channels on a plurality of integrated circuit chips, and aligning the plurality of integrated circuit chips by stacking the plurality of integrated circuit chips along the alignment rail.

In another embodiment, a method for manufacturing a three-dimensional chip package includes: forming an alignment ridge on an alignment rail, forming alignment channels on a plurality of integrated circuit chips and aligning the plurality of integrated circuit chips by stacking the plurality of integrated circuit chips along the alignment rail.

In a further embodiment, a method for manufacturing a three-dimensional chip package includes: forming a first linear groove on a first alignment rail and forming a second linear groove on a second alignment rail. The method further includes: attaching a first alignment rod to the first linear groove and attaching a second alignment rod to the second linear groove. The method then forms alignment channels on a plurality of integrated circuit chips and aligns the plurality of integrated circuit chips by stacking the plurality of integrated circuit chips along the first alignment rail and the second alignment.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
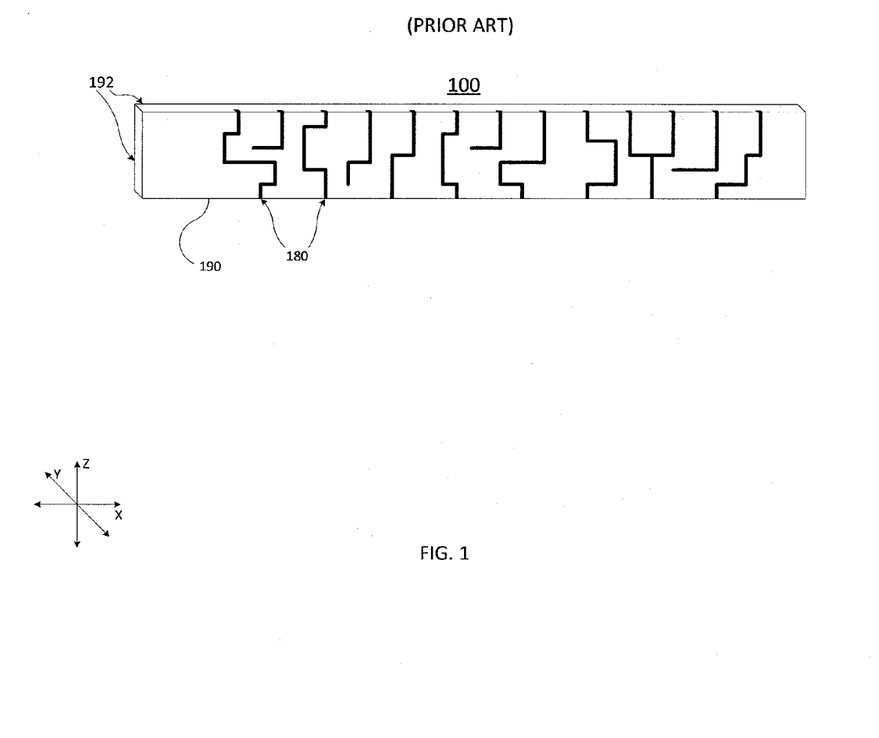
FIG. 1 illustrates an exemplary integrated circuit chip.

Advanced packaging techniques allow for the fabrication of high density circuitry through horizontal stacking of integrated circuit (IC) chips, also referred to as slices or sticks, to produce a set of stacked/aligned chips, e.g., a "brick", which is then polished and wired on the edges of the stacked chips. By way of example, FIG. 1 shows an exemplary integrated circuit chip 100. As illustrated in FIG. 1, the IC chip 100 is flipped on its edge exposing traces, or wires 180, on its top surface 190. The IC chip 100 also has one or more edges 192 and a bottom surface, which is on the back side of the chip 100 parallel to top surface 190 and is not visible in FIG. 1. The X, Y and Z axes are shown for reference. This same convention is used through the figures of the present disclosure. The challenge of assembly of the chips into a brick is the accurate alignment of these chips. One current methodology employed is banking the chips against a common banking surface. To illustrate, FIG. 2 shows a chip stacking arrangement that uses edge banking.

Figure 2:
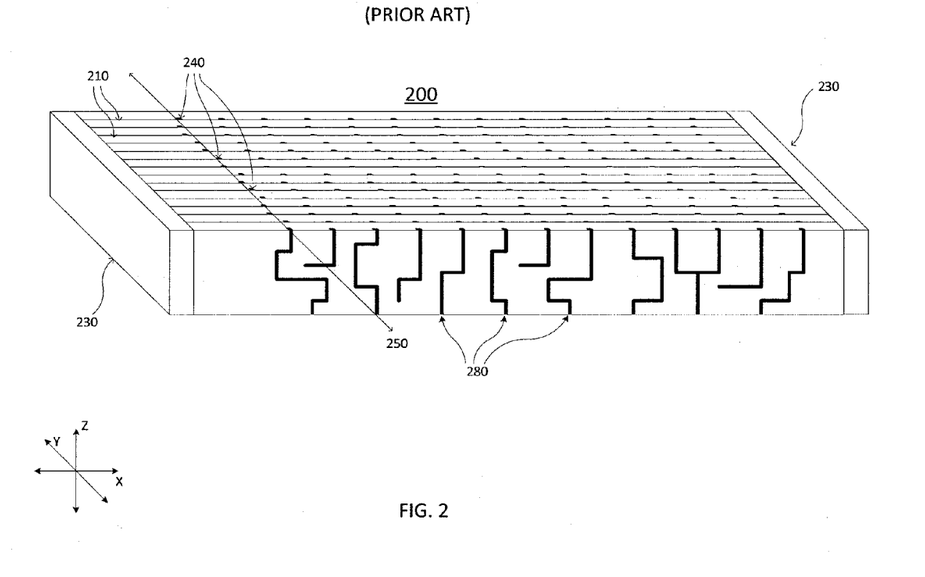
FIG. 2 illustrates a conventional chip stacking arrangement that uses edge banking.

As shown in FIG. 2, a number of IC chips 210 are arranged into a brick 200 (for clarity, only two chips are specifically identified in the figure). The IC chips 210 are aligned with one another by using one or more banking surfaces 230. For example, FIG. 2 shows a pair of banking surfaces 230 at opposite ends of the stack of IC chips to be aligned. The accuracy of this technique relies on the accuracy of the distance from the wiring on a chip to the chip edge. It should be noted that in the example of FIG. 2, the IC chips that comprise a brick are flipped on their sides 90 degrees as compared the typical orientation of a two-dimensional (2D) chip. For example, a typical 2D chip may be represented in the three dimensions having a top surface in the XY plane. The top surface is then rotated 90 degrees about the X axis to arrive at the vertical chip orientation shown in FIG. 2.

The edges of the chips 210 are typically defined by wafer dicing, which provides, at best, approximately 50 microns accuracy with customary manufacturing tools. This 50 micron error translates directly into misalignment of the wiring on the brick 200, which requires elaborate photolithography techniques to overcome, and limits the ultimate possibilities for the technique. To illustrate, FIG. 2 shows a number of external edge connections 240 on edges of a number of stacked IC chips 210. Each of the edge connections 240 may comprise an end of one of the wires 280 on one of the IC chips 210 (for clarity, only three of the edge connections are specifically identified). These wires 280 may sometimes be referred to as through-device-vias (TDVs). However, as shown in FIG. 2, several of the edge connections 240 deviate from an ideal line 250 on which the edge connections should align. Notably, the edge banking can result in deviations in multiple directions, e.g., along the X-axis as well as along the Z-axis (the shear direction).

It should be noted that the brick 200 may be designed for connection to another IC chip having a surface in the XY plane, e.g., a "two-dimensional" (2D) IC chip. For example, a 2D IC chip may comprise a logic device, and the brick 200 may comprise a stack of memory devices. Accordingly, the memory devices in the brick 200 may be coupled to the logic device by matching the edge connections 240 with corresponding connections on the top surface of the logic device. This type of arrangement is advantageous for high clock rate systems where the allowable distance between components is limited by the clock cycle. In particular, the logic device is closer to the memory components, input/output devices, electro-optic, radio frequency (RF) devices, and the like, allowing communication between the logic device and the other components within a single clock cycle, or in less clock cycles than if the peripherals were located on another portion of the same 2D chip as the logic device.

In contrast to conventional approaches that use a planar banking edge, embodiments of the present disclosure feature alignment rails having alignment grooves and/or alignment ridges formed thereon, along with complimentary alignment channels on a set of integrated circuit (IC) chips. The disclosed embodiments allow faster and more accurate alignment of a larger number of IC chips, e.g., up to and including twelve or more chips per brick, and achieve accurate alignment simultaneously in two directions, e.g., in the shear direction along the X-axis and Z-axis.

Figure 3A:
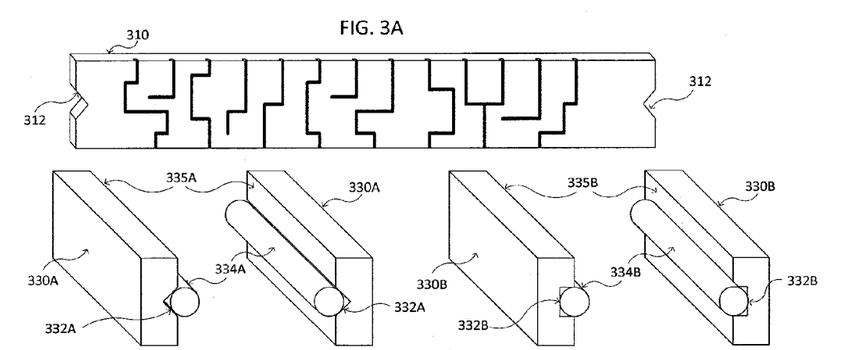
FIGS. 3(A), 3(B) and 3(C) illustrate one example of a chip stacking arrangement, according to the present disclosure.
Figure 3B:
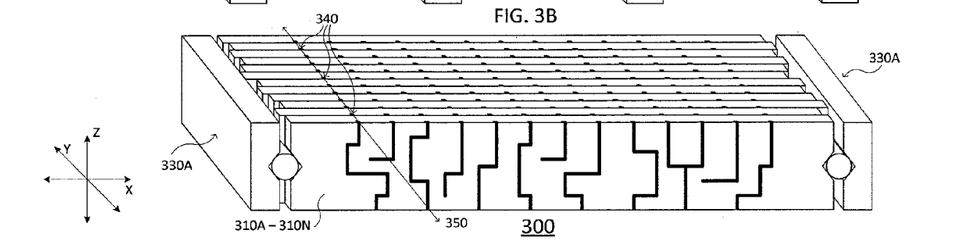
Figure 3C:
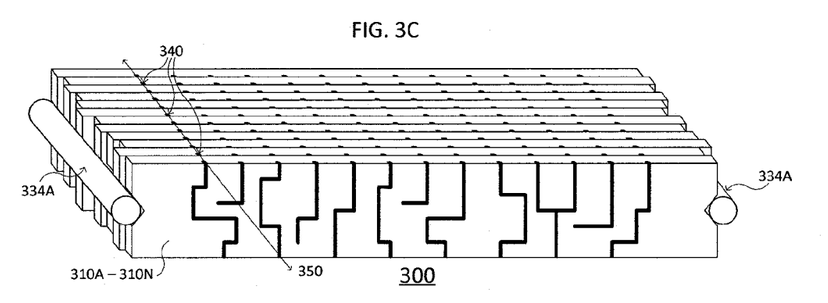

FIGS. 3(A), 3(B) and 3(C) show one example of a chip stacking arrangement according to the present disclosure. As illustrated in FIG. 3(A), one or more sets of alignment rails, e.g., 330A and 330B, are provided for aligning a number of IC chips into a brick. In one embodiment, the alignment rails 330A and 330B each comprise a bar, wafer, or chip of silicon, borosilicate glass, and/or the like. In one embodiment, one or more of the alignment rails 330A and 330B are machined with one or more grooves along one or more banking edges, e.g., 335A or 335B. The grooves may be formed using one or more MEMs (micro-electro-mechanical) manufacturing techniques, such as: micro-machining, anisotropic or isotropic etching, e.g., plasma etching, reactive ion etching (RIE) or deep reactive ion etching (DRIE), lithography, dicing and the like. For example, a groove may be formed by lithography and RIE, resulting in highly accurate dimensions. As shown in FIG. 3(A), alignment rails 330A each have a triangular or v-shaped linear groove 332A extending along the edge. Similarly, alignment rails 330B each have a square or rectangular-shaped linear groove 332B extending along the edge.

In either case, in one embodiment an alignment rod, e.g., 334A or 334B, is bonded or glued into each of the grooves. In one embodiment, the rods 334A and/or 334B may comprise one of a glass, a metal, a dielectric or a semiconductor that is formed using conventional machining techniques. In one embodiment, the rods 334A and 334B are formed having a cylindrical shape.

In addition, a complimentary channel is etched into the edges of the IC chips to be aligned. In one embodiment, the complimentary channel is formed along the dicing channel prior to chip separation, e.g., from a wafer. For example, triangular or v-shaped channels 312 are shown etched in chip 310. It should be noted that the examples of FIG. 3(A) are provided for purposes of illustration only. Thus, while a v-shaped channel 312 is shown in chip 310, in other, further and different embodiments, a channel of various other cross-sectional shapes may be formed, e.g., a square/rectangular or semi-circular-shaped channel, and the like. Similarly, although triangular/v-shaped linear grooves 332A and rectangular-shaped linear grooves 332B are shown in FIG. 3(A), the linear grooves formed in each of the alignment rails may take various other cross-sectional shapes suitable for accepting an alignment rod. In one embodiment, the channel 312 is formed using such techniques as: anisotropic or isotropic etching, e.g., plasma etching, reactive ion etching (RIE) or deep reactive ion etching (DRIE) in combination with photolithography, which allows precise alignment between features on the surface of the chip such as the wires that form the external connections 340 and the channel 312.

FIG. 3(B) shows a set of chips 310A-310L aligned into a brick 300 using the alignment rails 330A from FIG. 3(A). Although 12 chips are shown in brick 300, it should be understood that more or less chips may be included depending upon the particular application or design. When the chips 310A-310N are assembled by banking, they do not rely on the diced edge of the alignment rail(s), but on the accurate groove(s) defined by photolithography and precision etching. Notably, conventional dicing processes are accurate to approximately 50 microns, which translates directly into misalignments between wiring on the edges of brick of stacked chips. For example, as shown in FIG. 3(B) variations along the edges of each of the chips 310A-310L are visible near to the alignment rails 330A. However, by aligning the alignment channels to one or more alignment rods, an even greater precision is achieved with respect to the positions of the external connections 340, e.g., within tolerances of approximately 5 microns or less. As shown in FIG. 3B, each of the external connections 340 is properly aligned along an ideal line 350. In one embodiment the line width of the edge connections 340 may be as narrow as 5-50 microns.

For additional reference, FIG. 3(C) illustrates the brick 300 of chips 310A-310L aligned along alignment rails 334A, with the alignment rails 330A cut away.

It should be noted that the embodiment of FIGS. 3(A)-3(C) depicts the use of grooves, e.g., 332A, that extend linearly in the Y-direction along surfaces of the alignment rails that lie in the YZ-plane. Accordingly, the complimentary channel 312 in the IC chip 310 is on the shorter vertical edge(s) of the chip. For example, the IC chip 310 may have dimensions of approximately 1-3 mm in the vertical (Z-axis) direction, 25 mm in the horizontal (X-axis) direction, and have a thickness (in the Y-axis direction) of approximately 100-700 microns. In addition, up to 10-15 or more IC chips may be stacked per brick. For example, FIG. 3(B) shows twelve IC chips stacked in brick 300.

In another embodiment, the channel 312 may instead be located on the long edge of the chip 310. In this case, the alignment rails may be placed above and below the IC chips to be stacked. However, because the brick may comprise a memory that is to be connected to a logic circuit (e.g., a 2D logic circuit that may lie in the XY-plane), in one embodiment, the depth of the channel is approximately 70 microns or less, e.g., sufficient to be ground or polished off at a later stage so as to not interfere with corner crossings, e.g., the interfaces between the edge connections 340 on the edges of the IC chips and additional wiring of the brick or stacked IC chip package, wiring of other devices to be integrated, and so forth. For example, the brick may be further attached to another IC, such as a logic device, by way of one or more edge connections 340 on the edges of the aligned/stacked IC chips. For instance, the aligned IC chips may comprise memory devices to be mounted on or integrated with a logic device.

Figure 4A:
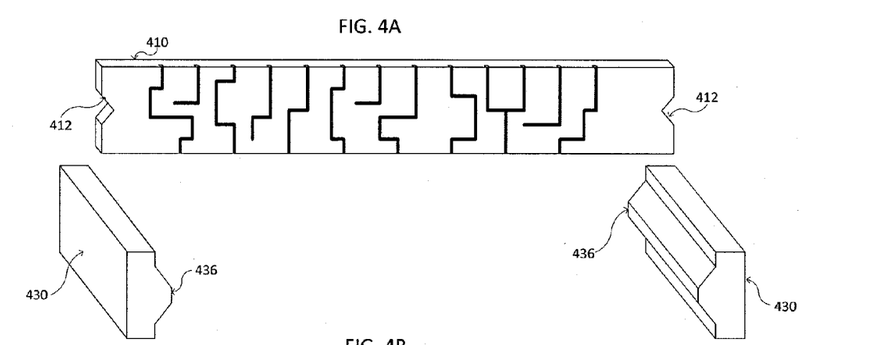
FIGS. 4(A) and 4(B) illustrate another example of a chip stacking arrangement, according to the present disclosure.
Figure 4B:
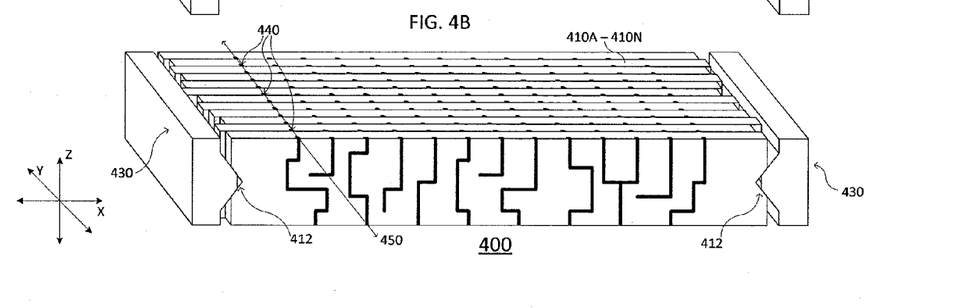

FIGS. 4(A) and 4(B) show another example of a chip stacking arrangement according to the present disclosure. As illustrated in FIG. 4(A) a positive ridge 436 is formed on the alignment rails 430. This eliminates the need for the separate rod(s), as shown in FIGS. 3(A) and 3(B). In one embodiment, each of the alignment rails 430 is etched around a ridge 436, leaving a triangular or other shaped ridge to fit into channels on the IC chips to be stacked. Like the example of FIGS. 3(A)-3(C), a complimentary channel is etched into the edges of the IC chips to be aligned. For example, triangular or v-shaped channels 412 are shown etched in chip 410.

As shown in FIG. 4(B), the channels 412 in the edges of the IC chips 410A-410L allow the set of IC chips to be aligned into a brick 400. Although 12 chips are shown in brick 400, it should be understood that more or less chips may be included depending upon the particular application or design. While alignment based upon the conventionally diced edges of IC chips can be accurate to within 50 microns, an even greater precision is achieved by aligning the alignment channels to an alignment ridge. For example, as shown in FIG. 4(B) variations along the edges of each of the IC chips 410A-410L are visible near to the alignment rails 430. However, despite these edge variations, each of the external connections 440 is properly aligned along an ideal line 450.

Figure 5:
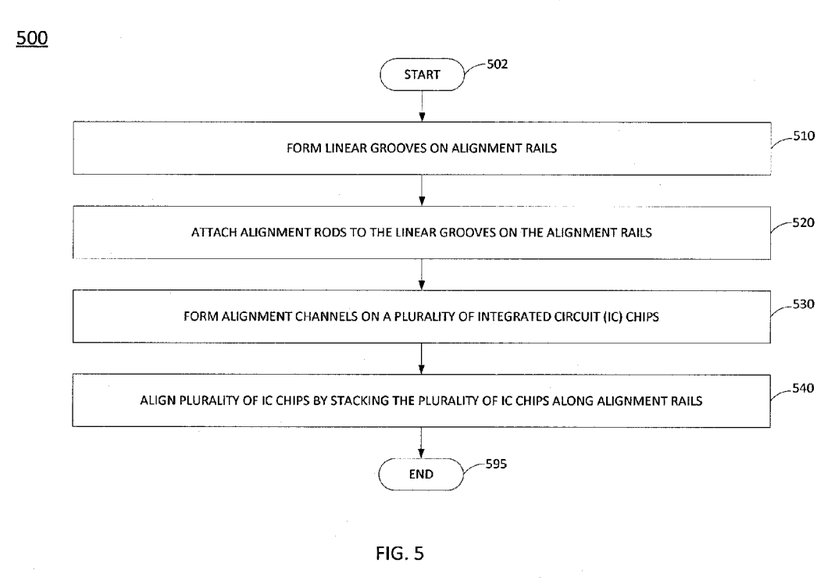
FIG. 5 illustrates a flowchart of an exemplary method according to one embodiment of the present disclosure.

FIG. 5 illustrates a flowchart of an exemplary method 500 for manufacturing a three-dimensional chip package. In particular, the method 500 may incorporate aspects of the above described chip stacking arrangements as illustrated in FIGS. 3(A) and 3(B).

The method 500 is initialized at step 502 and proceeds to step 510, where the method forms linear grooves on alignment rails. For example, as described above, an alignment rail may comprise a block or surface of silicon, borosilicate glass, or similar material that is suitable for etching, lithography and other fabrication techniques at a MEMs device scale. Accordingly, in one embodiment the linear grooves are formed at step 510 using an etching process, a dicing process, and/or a photolithography process. For example, a mask may be applied to a silicon surface, followed by an etching processed to form the linear grooves in the masked areas. In one embodiment, each of the linear grooves comprises a linear projection of a cross section removed from a surface of one of the alignment rails. In one embodiment, each of the linear grooves is formed having one of a triangular cross section, a square cross section, a rectangular cross section, a pentagonal cross section, a semi-circular cross section, a semi-elliptical cross section, and so forth. In one embodiment, the linear grooves may all have a same cross-sectional shape. However, in another embodiment, the linear grooves may take a plurality of different cross-sectional shapes. In addition, in one embodiment, a single linear groove is formed in each of the alignment rails. However, in another embodiment multiple linear grooves may be formed in each of the respective alignment rails. For example, where at least three linear grooves are used, a high degree of precision can be achieved. In particular, the three linear grooves will support three eventual points of contact with each IC chip, e.g., at points on respective alignment rods to be attached at step 520. As an example, a first alignment rail may have two linear grooves, while the opposite alignment rail has only a single linear groove.

At step 520, the method 500 attaches alignment rods to the linear grooves on the alignment rails. For example, a cylindrical or other shaped rod may be comprised of a glass, metal, dielectric or semiconductor material and is of a size and shape such that at least a portion of the rod fits within one of the linear grooves. For instance, if a linear groove comprises a triangular cross section, the alignment rod may be fabricated as a cylinder of such a size that a semi-circular portion of the rod extends beyond a planar surface of the alignment rail on which the linear groove is formed. In one embodiment, the alignment rods are glued to the linear grooves.

At step 530, the method 500 forms alignment channels on a plurality of integrated circuit (IC) chips, e.g., as shown in FIG. 3(A). In one embodiment, the alignment channels are formed using an etching and/or photolithography process. In one embodiment, the method uses lithography and deep silicon reactive ion etching (DRIE) to form the alignment channels. In one embodiment, the alignment channels are complimentary to the linear grooves and/or the alignment rods. For example, the alignment channels on the IC chips may have a same shape as the cross-sectional shape of the linear grooves on the alignment rails. However, in another embodiment, the alignment channels may have a different shape than that of the linear grooves. For instance, a linear groove having a rectangular cross section may be used in conjunction with alignment channels that are triangular. In one embodiment, the alignment channels are formed prior to dicing the chip(s) from a wafer. For example, an alignment channel may be formed in a dicing channel such that, when the chip is diced from the wafer, the alignment channel is then on an exposed edge of the chip. In one embodiment, each edge has at most one alignment channel. However, in another embodiment, a single edge may have two or more alignment channels, e.g., where a corresponding alignment rail or set of parallel alignment rails has two or more alignment rods/linear grooves per rail.

In step 540, the method 500 aligns the plurality of IC chips by stacking the chips along one or more of the alignment rails. For example, the method may align the IC chips with one another by matching an alignment channel of each of the IC chips with an alignment rod of one of the linear grooves. In one example, each of the plurality of IC chips has a top surface, a bottom surface and at least one edge surface, e.g., as shown in FIG. 3(A). Accordingly, the aligning may comprise stacking the plurality of integrated circuit chips in a direction that is normal to at least one of the top surface and the bottom surface, e.g., as shown in FIG. 3B. In one embodiment, the IC chips are glued together into a brick during the alignment at step 540. In one embodiment, the brick is further attached to another IC, such as a logic device, by way of one or more external connections on the edges of the aligned/stacked IC chips. For example, the aligned IC chips may comprise memory devices to be mounted on or integrated with a logic device.

The method then proceeds to step 595 where the method ends.

Figure 6:
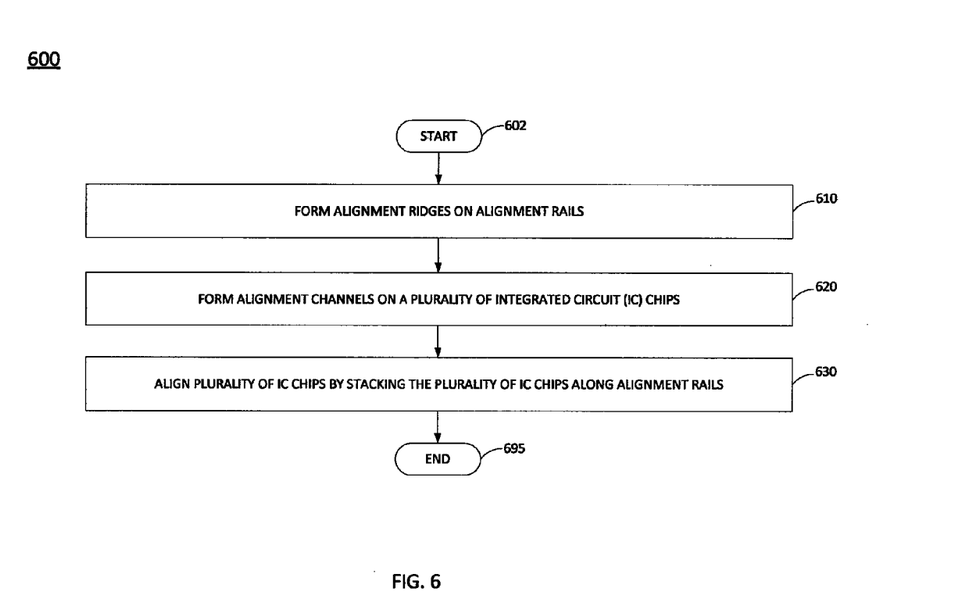
FIG. 6 illustrates a flowchart of an exemplary method according to another embodiment of the present disclosure.

FIG. 6 illustrates a flowchart of another method 600 for manufacturing a three-dimensional chip package. In particular, the method 600 may incorporate aspects of the above described chip stacking arrangement as illustrated in FIGS. 4(A) and 4(B).

The method 600 is initialized at step 602 and proceeds to step 610, where the method forms alignment ridges on alignment rails. For example, as described above, an alignment rail may comprise a block or surface of silicon, borosilicate glass, or similar material that is suitable for etching, lithography and other fabrication techniques at a MEMS device scale. Accordingly, in one embodiment linear alignment ridges are formed at step 610 using an etching process, a dicing process, and/or a photolithography process. For example, a silicon surface may be micro-machined, or a mask may be applied followed by a wet etch to form the alignment ridges in the masked areas. In one embodiment, each of the alignment ridges is formed having one of a triangular cross section, a square cross section, a rectangular cross section, a pentagonal cross section, a semi-circular cross section, a semi-elliptical cross section, and so forth extended linearly along a surface of the respective alignment rail. In one embodiment, a single alignment ridge is formed on each of the alignment rails. However, in another embodiment multiple alignment ridges may be formed on each of the respective alignment rails. In addition, in one embodiment the linear grooves may all have a same cross-sectional shape. However, in another embodiment, the linear grooves may take a plurality of different cross-sectional shapes.

At step 620, the method 600 forms alignment channels on a plurality of integrated circuit (IC) chips, e.g., as shown in FIG. 4(B). In one embodiment, the alignment channels are formed using an etching and photolithography process. In one embodiment, the method uses any one or more of the etching techniques described above in connection with step 610. In one embodiment, the method uses lithography and deep silicon reactive ion etching (DRIE) to form the alignment channels. In one embodiment, the alignment channels are complimentary to the alignment ridges on the alignment rails. For example, the alignment channels on the IC chips may have a same shape as the cross-sectional shape of the alignment ridges. However, in another embodiment, the alignment channels may have a different shape than that of the alignment ridges. For instance, an alignment ridge having a semi-circular cross section may be used in conjunction with alignment channels that have triangular, rectangular or pentagonal cross sections. In one embodiment, the alignment channels are formed prior to dicing the chip(s) from a wafer. For example, an alignment channel may be formed in a dicing channel such that, when the chip is diced from the wafer, the alignment channel is then on an exposed edge of the chip.

In step 630, the method 600 aligns the plurality of IC chips by stacking the chips along one or more of the alignment rails. For example, the method may align the IC chips with one another by matching one or more alignment channels of each of the IC chips with one or more alignment rails of one or more of the alignment ridges. In one example, each of the plurality of IC chips has a top surface, a bottom surface and at least one edge surface. Accordingly, the aligning may comprise stacking the plurality of integrated circuit chips in a direction that is normal to at least one of the top surface and the bottom surface, e.g., as shown in FIG. 4B. In one embodiment, the IC chips are glued together into a brick during the alignment at step 630. In one embodiment, the brick is further attached to another IC, such as a logic device, by way of one or more external connections on the edges of the aligned/stacked IC chips. For example, the aligned IC chips may comprise memory devices to be mounted on or integrated with a logic device.

The method then proceeds to step 695 where the method ends.

In addition, although not expressly specified above, one or more steps, functions or operations of methods 500 and 600 may include a storing, displaying and/or outputting step as required for a particular application. In other words, any data, records, fields, and/or intermediate results discussed in the respective methods can be stored, displayed and/or outputted to another device as required for a particular application. Furthermore, steps or blocks in FIG. 5 or 6 that recite a determining operation or involve a decision do not necessarily require that both branches of the determining operation be practiced. In other words, one of the branches of the determining operation can be deemed as an optional step.

Although various embodiments which incorporate the teachings of the present disclosure have been shown and described in detail herein, those skilled in the art can readily devise many other varied embodiments that still incorporate these teachings. It should also be noted that any specific dimensions described herein are provided by way of example only, and not by way of limitation. As such, the present disclosure is not limited to any particular scale, size or configuration, except as specifically recited in the claims.

What is claimed is:

1. A method for manufacturing a three-dimensional chip package, comprising:
   forming a linear groove parallel to the length of an alignment rail;
   attaching an alignment rod to the linear groove on the alignment rail;
   forming alignment channels on a plurality of integrated circuit chips, along in peripheral dicing edges of the plurality of integrated circuit chips; and
   aligning the plurality of integrated circuit chips by stacking the plurality of integrated circuit chips along the alignment rail, wherein the plurality of integrated circuit chips comprises more than two integrated circuit chips, and wherein the aligning results in an alignment of two or more connections formed in the peripheral dicing edges of the plurality of integrated circuit chips along an ideal line.

2. The method of claim 1, wherein the alignment channels on the plurality of integrated circuit chips are complementary to the alignment rod attached to the linear groove of the alignment rail.

3. The method of claim 1, wherein the linear groove on the alignment rail is formed by:
   an etching and photolithography process; or
   a dicing process.

4. The method of claim 1, wherein the alignment channels are formed by a photolithographic and etching process comprising at least one of:
   physical etching;
   reactive ion etching;
   isotropic etching;
   anisotropic etching; or
   deep reactive ion etching.

5. The method of claim 4, wherein the alignment channels are formed prior to a channel dicing process, wherein the channel dicing process separates a plurality of integrated circuit chips from a common wafer.

6. The method of claim 1, wherein the alignment rod comprises:
   a glass;
   a metal;
   a semiconductor; or
   a dielectric.

7. The method of claim 1, wherein the alignment rod has a cylindrical shape.

8. The method of claim 1, wherein the linear groove comprises a linear projection of a cross section removed from a surface of the alignment rail.

9. The method of claim 1, wherein the linear groove is formed having one of:
- a triangular cross section;
- a rectangular cross section;
- a pentagonal cross section;
- a semi-circular cross section; or
- a semi-elliptical cross section.

10. The method of claim 1, wherein the aligning forms a brick comprising the plurality of integrated circuit chips.

11. The method of claim 1, wherein each of the plurality of integrated circuit chips has a top surface, a bottom surface and at least one of the peripheral dicing edges.

12. The method of claim 11, wherein the aligning comprises stacking the plurality of integrated circuit chips in a direction that is normal to at least one of the top surface and the bottom surface.

13. The method of claim 11, wherein wherein the two or more connections each comprises an external connection that connects one of the plurality of integrated circuit chips to another of the plurality of integrated circuit chips.

14. The method of claim 11, further comprising:
attaching the plurality of integrated circuit chips to another integrated circuit chip along the at least one of the peripheral dicing edges of at least one of the plurality of integrated circuit chips.

15. The method of claim 1, wherein the alignment rail comprises at least one of:
- silicon; or
- borosilicate glass.

16. The method of claim 1, wherein the peripheral dicing edges are located on perimeters of the plurality of integrated circuit chips.

17. The method of claim 1, wherein the aligning comprises aligning the peripheral dicing edges of the plurality of integrated circuit chips.

18. The method of claim 1, wherein the aligning aligns the plurality of integrated circuit chips simultaneously along two directions.

19. A method for manufacturing a three-dimensional chip package, comprising:
forming a first linear groove parallel to the length of a first alignment rail;
forming a second linear groove parallel to the length of a second alignment rail;
attaching a first alignment rod to the first linear groove;
attaching a second alignment rod to the second linear groove;
forming alignment channels on a plurality of integrated circuit chips, in peripheral dicing edges of the plurality of integrated circuit chips; and
aligning the plurality of integrated circuit chips by stacking the plurality of integrated circuit chips along the first alignment rail and the second alignment rail, wherein the plurality of integrated circuit chips comprises more than two integrated circuit chips, and wherein the aligning results in an alignment of two or more connections formed in peripheral edges of the plurality of integrated circuit chips along an ideal line.

20. The method of claim 19, further comprising:
forming a third linear groove on one of the first and second alignment rails; and
attaching a third alignment rod to the third linear groove, wherein the aligning further comprises stacking the plurality of integrated circuit chips along the third alignment rail.

* * * * *